United States Patent
Wright et al.

[11] Patent Number: 6,026,496
[45] Date of Patent: Feb. 15, 2000

[54] METHOD AND APPARATUS FOR GENERATING A PULSE

[75] Inventors: Jeffrey P. Wright, Boise, Id.; Steven F. Schicht, Austin, Tex.

[73] Assignee: Micron Technology, Inc., Boise, Id.

[21] Appl. No.: 09/001,738

[22] Filed: Dec. 31, 1997

[51] Int. Cl.[7] .................................................. G06F 1/04
[52] U.S. Cl. ........................ 713/500; 713/503; 713/600
[58] Field of Search .................................. 713/400, 401, 713/500, 501, 503, 600, 601; 327/172, 173, 174, 181, 291

[56] References Cited

U.S. PATENT DOCUMENTS

| | | | |
|---|---|---|---|
| 5,033,001 | 7/1991 | Ibi ........................................... | 713/500 |
| 5,517,137 | 5/1996 | Stephens, Jr. .............................. | 326/93 |
| 5,557,225 | 9/1996 | Denham et al. ........................ | 327/199 |
| 5,729,169 | 3/1998 | Roohparvar .............................. | 327/227 |
| 5,764,582 | 6/1998 | Tai ........................................... | 365/222 |

*Primary Examiner*—Dennis M. Butler
*Attorney, Agent, or Firm*—Dorsey & Whitney LLP

[57] ABSTRACT

A circuit for generating a pulse with minimal delay after receiving a trigger signal includes a passgate, a gating circuit, and a reset circuit. The passgate is enabled by control signals received at the gating circuit having a trigger signal as one of the control signals. The trigger signal is also presented as an input to the passgate. When enabled, the passgate propagates the trigger signal to an output. A predetermined time after the trigger signal appears at the passgate input, a passgate control signal is turned off, thereby preventing the trigger signal from further passing through the passgate. The reset circuit is then turned on, which pulls the signal at the output of the passgate to a reference voltage, ending the pulse. Once the pulse is generated, it can be rectified and further combined with other signals to produce signals used in other parts of the circuit.

52 Claims, 6 Drawing Sheets

METHOD AND APPARATUS FOR GENERATING A PULSE

TECHNICAL FIELD

This invention relates to clocked integrated circuits, and more particularly, to a method and apparatus to generate a pulse with minimal delay after receiving a trigger signal.

BACKGROUND OF THE INVENTION

Clock signals are used by a wide variety of digital circuits to control the timing of various events occurring during the operation of the digital circuits. For example, clock signals are used to designate when command signals, data signals, and other signals used in memory devices and other computer components are valid and can thus be used to control the operation of the memory device or computer system. For instance, a clock signal can be used to develop sequential column addresses when an SDRAM is operating in burst mode.

Generating a signal using a clocked signal as an input can be difficult to coordinate. Some of the signals generated may need to be timed to either a rising or falling edge of a clock signal, or may become operative only after a given number of clock cycles. Many circuits have been created to coordinate these signals with clock signals, with varying degrees of success. One of the problems with generating signals from a clock signal is a time delay caused by additional circuitry needed for the coordination. Each component used in a circuit (logic gate, buffer, amplifier, etc.) introduces a time delay when producing a signal. Capacitive loading, internal resistance, and other factors cause this delay. To keep the delay caused by additional components to a minimum, circuits using a clocked signal to help generate other signals should be made with as few components as necessary. As memory speeds, bus speeds, and processor speeds increase, it becomes even more important to minimize or eliminate delays in clocked signal generation circuits.

An example of a circuit that uses a clocked signal as an input to generate other signals is shown in FIG. 1. A signal generation circuit 10 includes a NAND gate 40 receiving a clock input signal CLK from a circuit input terminal 20. The NAND gate 40 also receives an inverted, delayed clock signal IDCLK that is produced by coupling the clock signal CLK through an inverter 32 and a delay circuit 34. To be operational, the NAND gate 40 requires a logic 0 or LOW signal to be asserted at an inverted enable input 46. In conventional circuits, the LOW signal is typically at 0 volts and the HIGH signal is at 5 volts, 3.3 volts or some other voltage, depending on the circuit. A column signal COL is received at a circuit input terminal 22 and then inverted at an inverter 36. A HIGH COL signal coupled through the inverter 36 enables the NAND gate 40. As further discussed below, there is a delay time between the times when the signal is received at the input of a logic gate and when the signal is produced at the output of the logic gate.

The signal generation circuit 10 produces an Input/Output pull-up, or IOPU signal at a circuit output terminal 60 based on the CLK, IDCLK and COL signals. When the clock signal CLK goes HIGH, the output of the delay circuit 34 remains HIGH for a short delay period, thereby causing the NAND gate 40 to output a LOW pulse signal P1. After the delay of the delay circuit 34, the output of the delay circuit goes LOW, thereby causing the output of the NAND gate 40 to go HIGH, thereby terminating the pulse signal P1. The pulse signal P1 generated at the NAND gate output is delayed by a delay circuit 52 and then inverted three times at inverters 54, 56, and 58, respectively. The IOPU signal generated by the inverter 58 is coupled to the circuit output terminal 60. This signal is used in a data path of a memory circuit to restore I/O lines to a desired voltage between data access cycles.

The operation of the signal generating circuit 10 will be described with reference to the timing diagram of FIG. 2. Assuming, for illustration, that the COL signal is always in a HIGH state, generating the pulse signal P1 is controlled only by the CLK and IDCLK signals received at the NAND gate 40. Before the time t0, the CLK signal has been at a LOW state for some time period; IDCLK will be HIGH by virtue of the inverter 32. Since the NAND gate 40 has one LOW and one HIGH input, the output of the NAND gate 40 is also HIGH, shown as trace P1 in FIG. 2. At time t0, the CLK signal changes from the LOW state to a HIGH state. As stated above, because of capacitance, resistance, and other factors within a logic device, there is a delay between the time a signal is presented on the input to the logic device and when a signal is generated at the output of the logic device. This propagation delay can vary from one logic device to another based on such factors as the number of inputs, the size of transistors within the logic gates and other factors. For convenience, one standard propagation delay period for all logic devices is assumed.

Immediately after the CLK switches from a LOW to HIGH at time t0, the signal received at the NAND gate 40 also changes to HIGH. As explained below, the other NAND gate 40 input still retains the HIGH signal it was receiving prior to the time the clock signal changed. Since both inputs are HIGH, the NAND gate 40 will generate a LOW output signal. Howvever, due to the logic gate propagation delay of the NAND gate 40, the pulse signal P1 remains HIGH until time t1. At time t1, the logic gate propagation delay has elapsed and the pulse signal P1 falls from HIGH to LOW. This logic gate propagation delay for the NAND gate 40 is shown on the P1 trace, labeled as lgpd40.

After the rising CLK edge at time t0, the CLK signal begins propagating through the inverter 32 and the delay circuit 341 to generate the IDCLK signal. First, a logic gate propagation delay exists when passing through the inverter 32. Next, the inverted CLK signal is delayed by the delay circuit 34, which has been added to postpone the CLK signal change. The time delay of delay circuit 34 is determined by the design engineer and built into the integrated circuit. This delay will ultimately select the length of the pulse signal P1. The logic gate propagation delay caused by the inverter 32 is shown as lgpd32 on trace IDCLK, while the time delay due to the delay circuit 34 is shown as td34. Once the CLK signal has passed through the inverter 32 and the delay circuit 34 at time t5, the IDCLK signal changes from HIGH to LOW. When IDCLK falls to a LOW signal at time t5, the NAND gate 40 has one HIGH input and one LOW input. This causes the NAND gate 40 to output a HIGH signal. Following another logic gate propagation delay for the NAND gate 40, the pulse signal P1 is pulled HIGH and the pulse is complete. This second propagation delay is also shown on trace P1.

The pulse signal P1 created at the output of the NAND gate 40 is deficient for use as an IOPU. First, the pulse signal P1 is a negative pulse beginning HIGH, falling LOW and then pulled back HIGH. The IOPU signal requires the opposite orientation. Second, the output pulse signal P1 lacks the driving capability needed by the circuit. The low driving capacity pulse signal P1 has a relatively shallow slope when compared to the steep slope of the high driving capacity CLK signal. Because of these deficiencies, the output pulse signal P1 must be inverted and buffered before it can be used as an IOPU signal.

After the pulse signal P1 is generated by the NAND gate 40, the delay circuit 52 delays it. This delay circuit is necessary to coordinate the IOPU signal with other signals generated in the signal generating, circuit 10, for instance, CDEn at a circuit output terminal 62 and CDE_R at a circuit output terminal 64. These other signals are generated within the signal generating circuit 10 by circuitry generally labeled as 50. The added delay from the delay circuit 52 is shown in FIG. 2 on the I1 trace. The trace for I1 parallels trace P1, except that I1 trails the P1 trace by the time delay created by the delay circuit 52.

The signal I1 next propagates to the inverter 54, the output of which is shown as trace I2 in FIG. 2. The signal I2 output by the inverter 54 is inverted compared to the signal I1. The trace for I2 also differs from that of I1 in that it trails by another logic gate propagation delay ascribed to the inverter 54, labeled as Igpd54. The inverter 54 also buffers the signal, seen by the sharper pull-up curves from LOW to HIGH beginning at time t3. The signal I2 has the correct orientation to become the IOPU signal, but still lacks enough drive capacity. A convenient way to buffer a signal while retaining its original orientation is to pass the signal through two inverter circuits. The signal I2 is then propagated to inverter 56 shown as trace I3. Following the logic gate propagation delay for the inverter 56 shown on trace I3, the signal is again inverted and buffered. Finally, the signal I3 is propagated through the inverter 58, shown as a trace IOPU. Again, after the standard logic gate propagation delay for inverter 58, the signal is inverted and buffered. The signal IOPU at circuit output terminal 60 has the desired orientation and has sufficient driving power to be used as the Input/Output pull-up signal.

Given today's demand for faster memory circuits, there is a need to develop signal generation circuitry which can generate an IOPU signal of the correct orientation and drive capacity with fewer delays due to logic gates than the current state of the art.

SUMMARY OF THE INVENTION

A pulse generation circuit comprises a passgate adapted to receive a trigger or periodic signal, a gating circuit for controlling the passgate, and a reset circuit that ends the pulse and prepares it for the next cycle. Once the gating circuit receives control signals indicating a pulse is to be generated, the passgate is opened and waits for the next edge of the trigger signal. The trigger signal is passed through the passgate producing a signal at a passgate output terminal. The gating circuit then closes the passgate so the trigger signal no longer propagates through the passgate although the signal remains at the passgate output until the reset circuit couples the passgate output terminal to a voltage, and completes the pulse.

In one embodiment, the pulse generated in the pulse generation circuit is amplified using serially coupled inverters to become an Input/Output pull-up signal.

In another embodiment, the pulse generation circuit generates a positive pulse when a rising edge of the trigger signal is received, and the reset circuit couples the passgate output terminal to a ground voltage at the end of the generated pulse.

In yet another embodiment, the gating circuit changes the passgate from a passing state to a blocking state when the gating circuit receives a control signal derived from the trigger signal.

In still yet another embodiment, the gating circuit changes the states of the passgate based on a control signal derived from the output of the passgate.

DETAILED DESCRIPTION OF THE INVENTION

Figure 1:
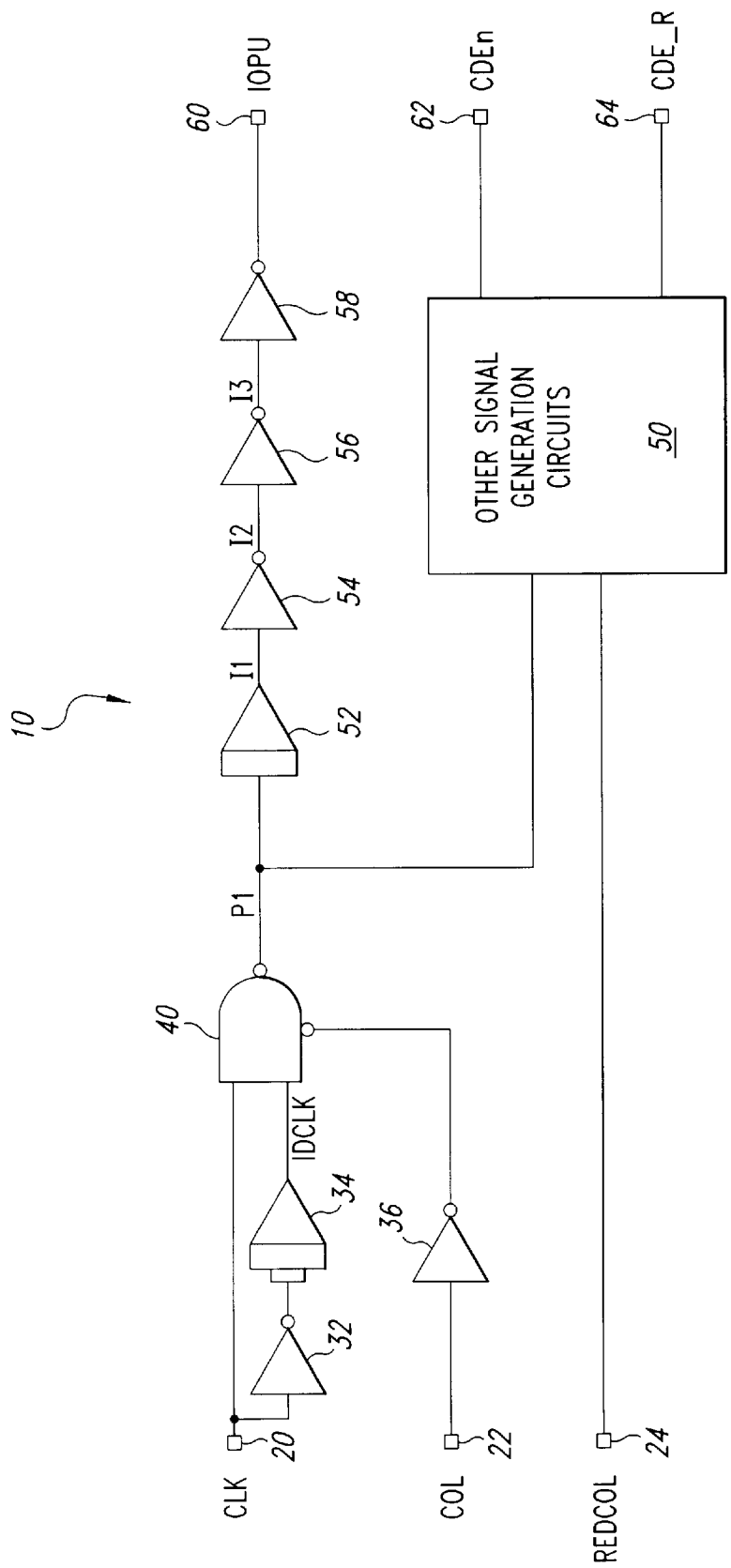
FIG. 1 is a schematic diagram of a conventional signal generation circuit used to produce an Input/Output pull-up signal.
Figure 3:
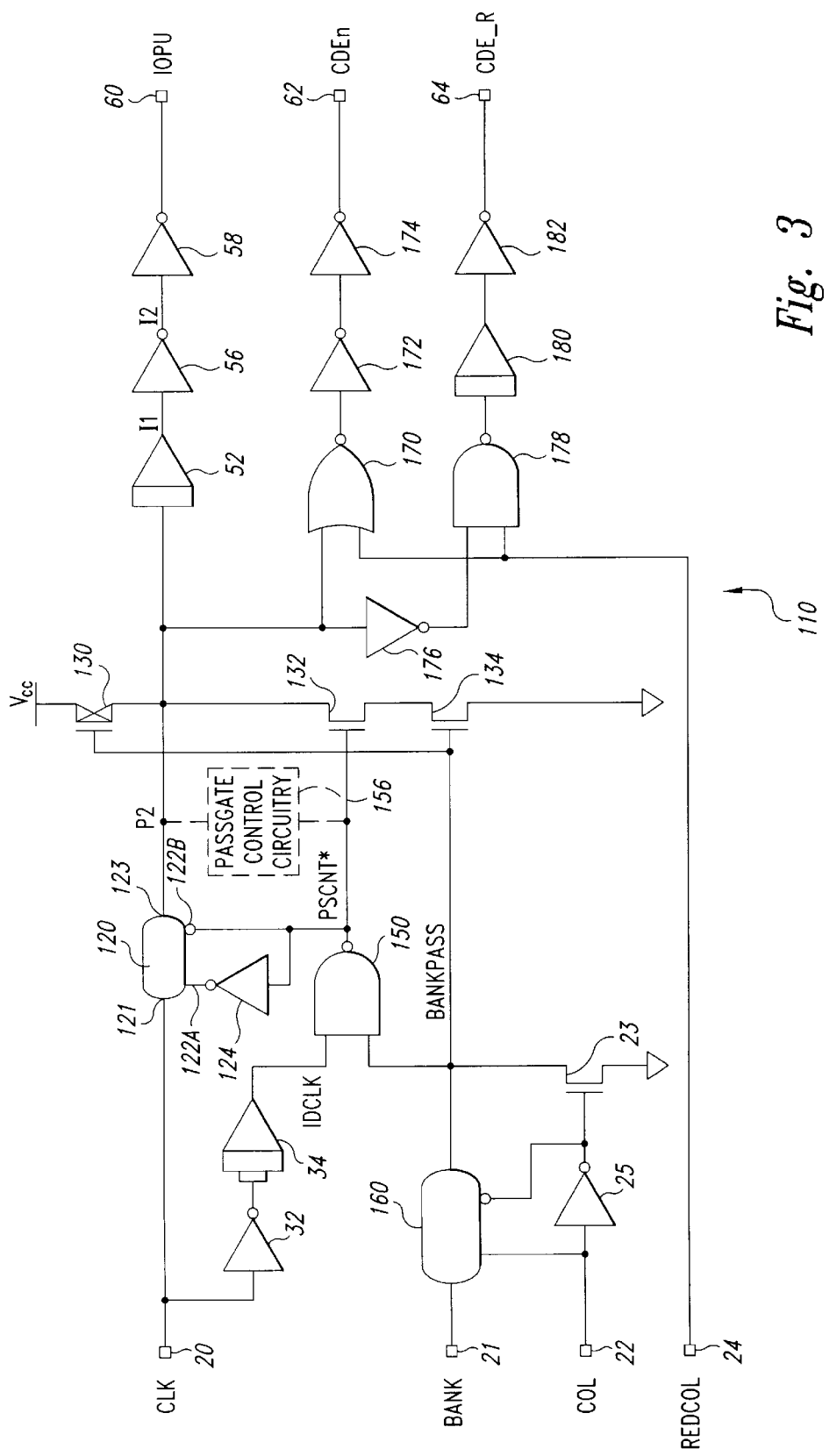
FIG. 3 is a schematic diagram of a signal generation circuit including a passgate circuit according to one embodiment of the present invention.

One embodiment of a signal generating circuit 110 in accordance with the invention is illustrated in the schematic diagram of FIG. 3. The signal generating circuit 110 includes some of the same components as the signal generation circuit 10, shown in FIG. 1. Identical components of the signal generating circuits 10 and 110 have been given the same reference numbers, and for the sake of brevity, will not be described in further detail. The signal generation circuit 110 includes a passgate 120 accepting the CLK signal at an input terminal 121. The passgate 120 receives a passgate control signal PSCNT* at a non-inverting input 122b and through an inverter 124 at an inverting input 122a. The passgate 120 passes the CLK signal to an output terminal 123 when enabled by a LOW PSCNT* signal, and blocks the CLK signal from passing when not enabled by a HIGH PSCNT* signal.

Another passgate 160 passes or blocks a bank signal BANK received from a circuit input terminal 21. The passgate 160 is controlled by the COL signal, which is directly applied to a non-inverting input, and applied through an inverter 25 to an inverting input. The passgate 160 thus passes the BANK signal only when the COL signal received from the circuit input terminal 22 is HIGH. The resulting LOW signal at the output of the inverter 25 is applied to a gate of an NMOS transistor 23, keeping it OFF. Because the transistor 23 is OFF, a BANKPASS signal passed through the passgate 160 is isolated from a ground voltage.

During the time period when the IOPU signal is generated by the signal generator circuit 110, both the COL signal and the BANK signal are held HIGH. Since this causes the BANKPASS signal to be held HIGH, an NMOS transistor 134 is turned ON, coupling the source of an NMOS transistor 132 to ground. If the BANKPASS signal was LOW, the transistor 134 would be OFF and a PMOS transistor 130 would be ON, keeping the output P2 of the passgate 120 at a voltage $V_{cc}$. When the BANKPASS signal is HIGH, the transistor 134 is ON while the transistor 130 is OFF. Thus, the signal PSCNT*, coupled to the gate of the transistor 132 determines whether the signal P2 follows the CLK signal, or is coupled through the transistors 132 and 134 to ground. When the signal PSCNT* is LOW, transistor 132 is OFF and, since the passgate 120 is in the passing state, the signal P2 will be at or near the same level as the CLK signal. When PSCNT* goes HIGH, transistor 132 turns ON, pulling the signal P2 to ground.

In an alternative embodiment, the signal generating circuit 110 includes passgate control circuitry 156 coupled between the output of the passgate 120 and the non-inverting input 122b of the passgate 120. In this embodiment, circuitry exists to control the operation of the passgate 120 based on its output. For instance, the passgate control circuitry 156 can enable the passgate 120 to pass the CLK signal. When the clock signal goes HIGH and pulls the signal P2 HIGH, the passgate control circuitry 156 can then disable the passgate by generating a HIGH signal for PSCNT*. After the passgate control circuitry 156 disables the passgate 120, the control circuitry then reenables the passgate for another cycle.

Control signals CDEn and CDE_R are also generated using the pulse signal P2 as an input. To generate the signal CDEn, the pulse signal P2 and a redundant column signal REDCOL received at a circuit input terminal 24 are combined at a NOR gate 170. The signal is then twice amplified through a pair of inverters 172 and 174 before being output at a circuit output terminal 62. This signal is then used in other parts of the memory circuit, such as controlling the timing of a column select signal (CSEL) in a column decoder circuit of an SDRAM. The signal CDE_R is generated by combining the pulse signal P2, after it has been inverted through an inverter 176, with the signal REDCOL in a NAND gate 178, delayed through a delay gate 180 and inverted by an inverter 182. The signal CDE_R is then output at a circuit output terminal 64. The signal CDE_R is also used in generating the CSEL signal and other signals in an SDRAM memory circuit.

Figure 4:
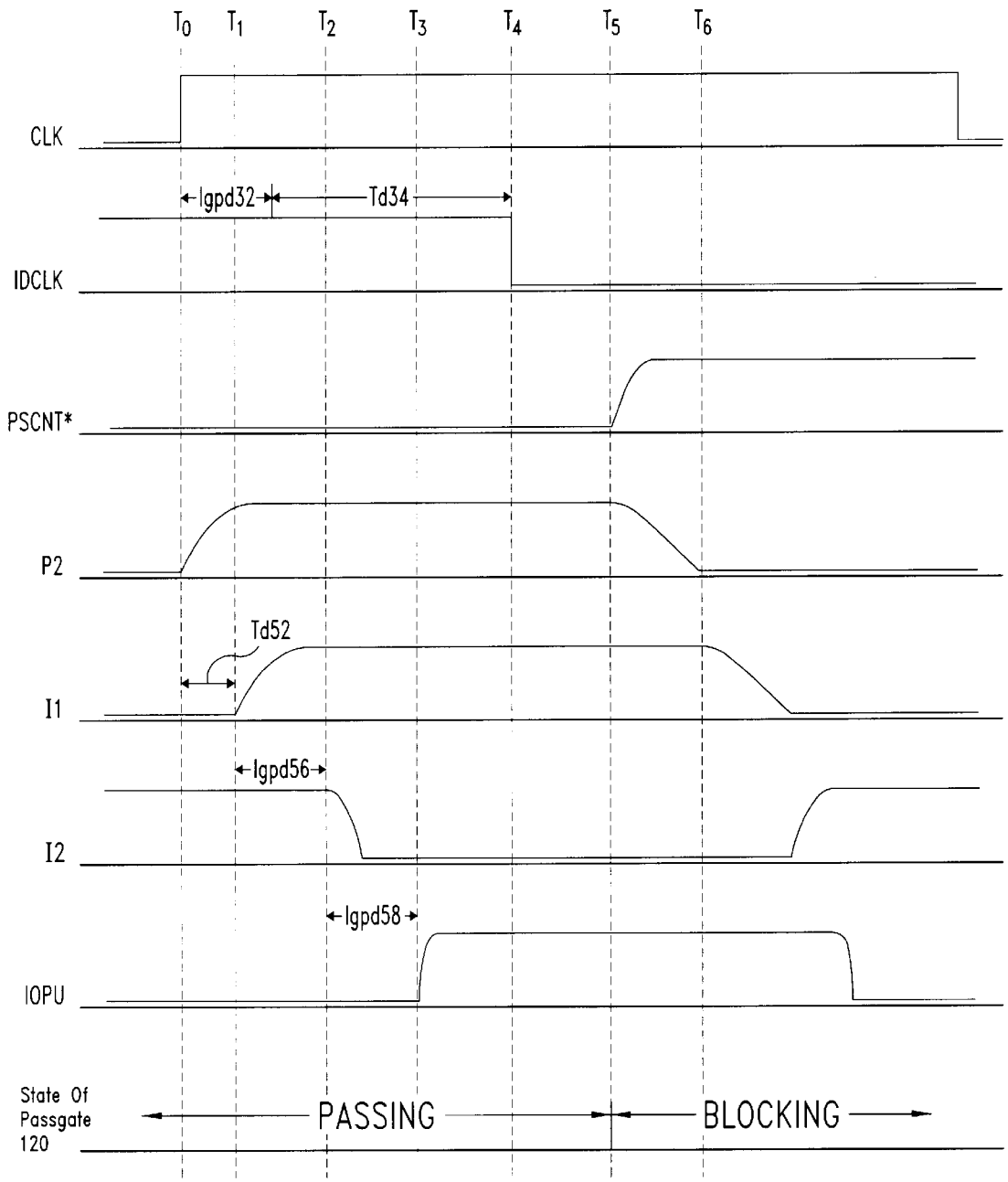
FIG. 4 is a timing diagram of various signals during operation of the signal generation circuit of FIG. 3.

The operation of signal generating circuit 110 will now be explained in conjunction with the signal timing diagram shown in FIG. 4. Before the time t0, the CLK has been stable at a LOW signal for some time period. The signal IDCLK applied to a NAND gate 150 is HIGH by virtue of the inverter 32. As discussed above, BANKPASS is assumed HIGH during the IOPU signal generation. Since both of the inputs 152 and 154 are HIGH, the passgate control signal PSCNT* at an output of the NAND gate 150 is LOW, shown as a trace PSCNT* on FIG. 4. This LOW PSCNT* signal places the passgate 120 in the passing state.

The CLK signal has a rising edge at time t0. Since the passgate 120 remains in a conducting state, a pulse signal P2 at the output 123 of the passgate 120 immediately begins to rise as shown in the P2 trace. IDCLK remains HIGH due to the logic gate propagation delay of CLK through the inverter 32 and the negative edge CLK delay at the delay gate 34, as shown on the IDCLK trace. Because the passgate 120 is enabled during these delay times, the CLK signal is continuously supplied to the output terminal 123. At t4, after the logic gate propagation delay of the inverter 32 and time delay of the delay circuit 34, IDCLK changes from HIGH to LOW. After the propagation delay of the NAND gate 150, the output signal PSCNT* changes from LOW to HIGH at t5. The passgate 120 then changes from the passing to the blocking state, and does not allow the CLK signal to pass through it, even though the CLK signal remains HIGH at t5. Since the delay time td34 shown on the IDCLK trace ultimately determines the length of the IOPU signal, the circuit design engineer sizes the delay time according to the needs of the circuit. After t5, the falling edge of the pulse signal P2 begins. As PSCNT* changes from LOW to HIGH at time t5, an NMOS transistor 132 turns ON, and since NMOS Transistor 134 is already on as discussed above, the output 123 of passgate 120 becomes coupled to the ground voltage. At time t5, because BANKPASS is high, a PMOS transistor 130 is off, isolating the output 123 of the passgate 120 from a Vcc voltage. By time t6, the transistors 132 and 134 have completely pulled the pulse signal P2 to the ground voltage, ending the pulse signal P2. Unlike the pulse signal P1 generated by the signal generation circuit 10, the pulse signal P2 has the same orientation as IOPU.

The pulse signal P2 begins amplification shortly after its rising edge. The pulse signal P2 is delayed through the delay gate 52 before entering the input for the inverter 56. The time delay due to the delay gate 52 is shown as td52 in trace I1. At time t1, the rising pulse signal P2 arrives at an input to the inverter 56. The inverter 56 inverts the signal I1 after the standard logic gate propagation delay, shown on trace 12. At time t2, the signal I2 arrives at an input to the inverter 58. The inverter 58 inverts the signal I2 after the standard logic gate propagation delay, shown on trace IOPU. The output produced by the inverter 58 has the correct orientation and drive capacity for the IOPU signal.

Figure 2:
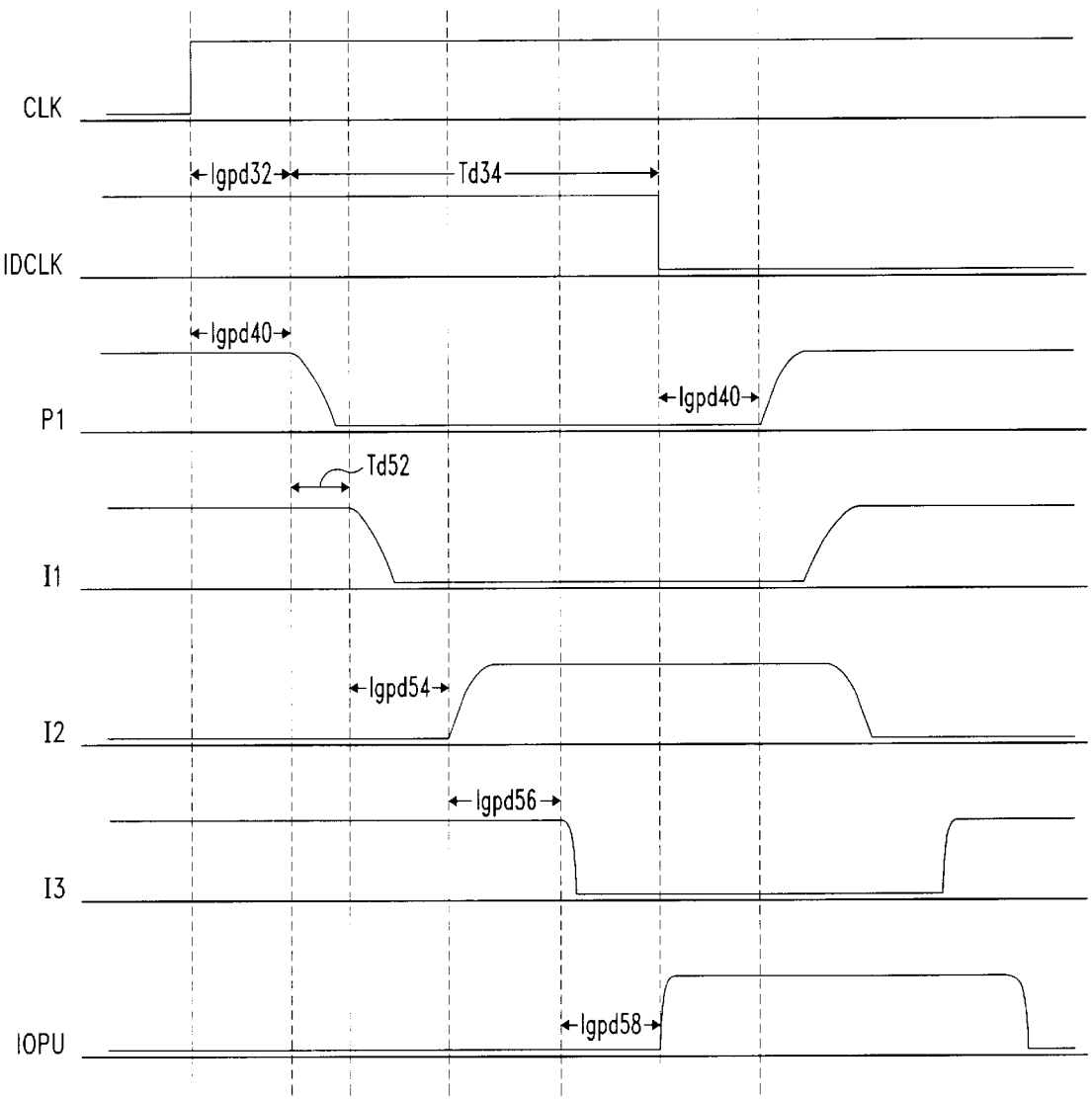
FIG. 2 is a timing diagram of various signals during operation of the signal generation circuit of FIG. 1.

Referring back to FIG. 2, the time delay of the prior art circuit from the rising CLK edge until the rising edge of the IOPU signal included four logic propagation delays and one time delay (1gpd4+td52+1gpd54+1gpd56+1gpd58). In the embodiment of the invention shown in FIG. 3, the time delay from the rising edge of the CLK to the rising edge of the IOPE signal includes only two logic gate propagation delays and one time delay (td52+1gpd56+1gpd58). The embodiment of the invention shown in FIG. 3 saves two logic propagation delay times because it uses the passgate 120. By using the passgate 120, the pulse signal P2 is created immediately upon the rising edge of the CLK signal, without waiting for the propagation delay through the NAND gate 40, saving one propagation delay over the prior art circuit. Additionally, since the passgate creates the pulse signal P2 in the same orientation as the desired IOPU signal, it need only be inverted twice, rather than the three times, of the prior art saving the propagation delay of the inverter 54.

Figure 5:
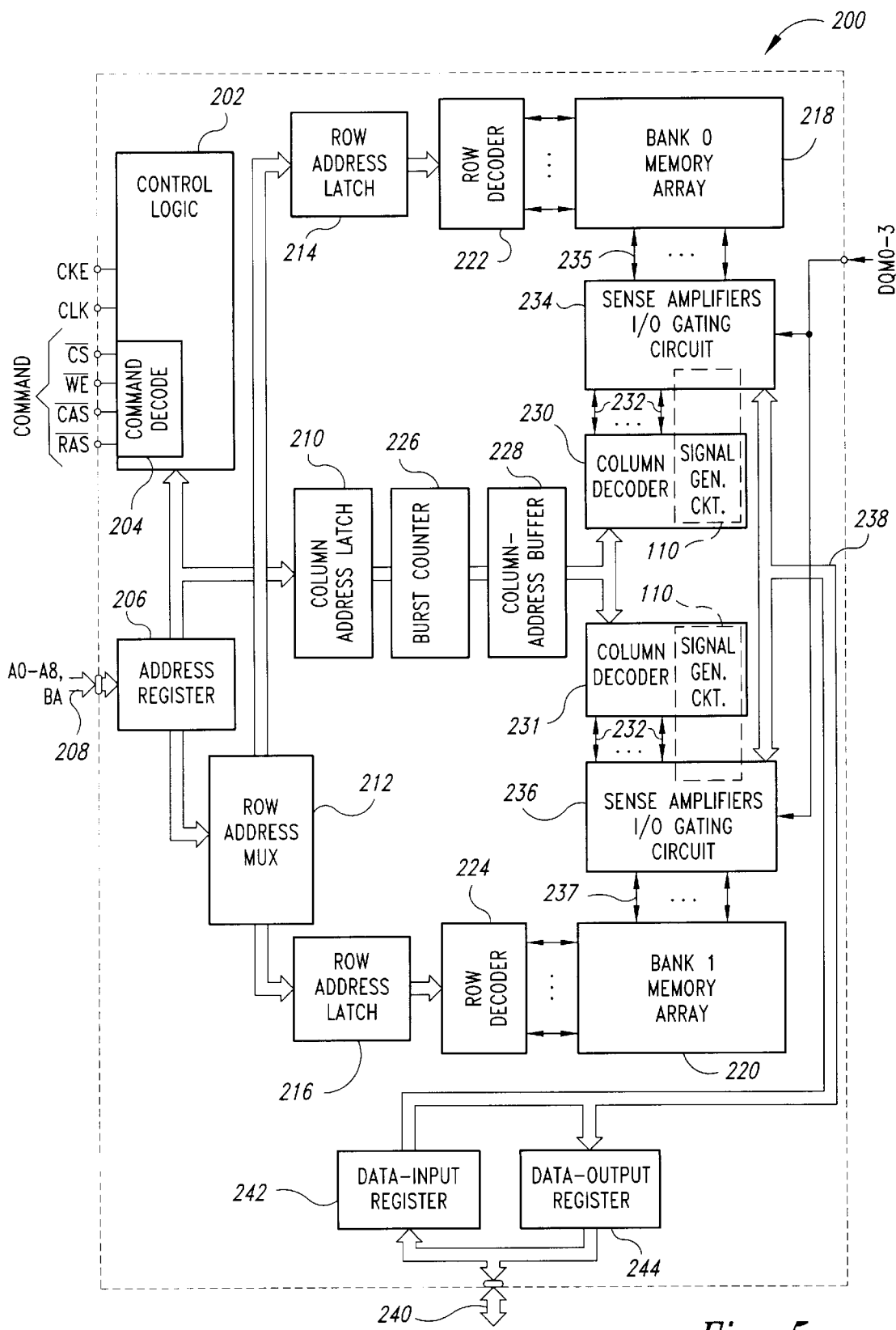
FIG. 5 is a block diagram of a synchronous dynamic random access memory including the pulse generation circuit of FIG. 3.

A synchronous dynamic random access memory (SDRAM) 200 using the signal generation circuit 110 of FIG. 3 is shown in FIG. 5. The SDRAM 200 has a control logic circuit 202 receiving a clock signal CLK and a clock enable signal CKE. In the SDRAM 200, all operations are referenced to a particular edge of the clock signal CLK, typically the rising edge, as known in the art. The control circuit 202 further includes a command decode circuit 204 receiving a number of command signals on respective external terminals of the SDRAM 200. These command signals typically include a chip select signal $\overline{CS}$, write enable signal $\overline{WE}$, column address strobe signal $\overline{CAS}$, and row address strobe signal $\overline{RAS}$. Specific combinations of these signals define particular data transfer commands of the SDRAM 200 such as ACTIVE, PRECHARGE, READ, and WRITE as known in the art. An external circuit, such as a processor or memory controller, generates these data transfer commands to read data from and to write data to the SDRAM 200.

The SDRAM 200 further includes an address register 206 operable to latch an address applied on an address bus 208, and output the latched address to the control circuit 202, a column address latch 210, and a row address multiplexer 212. During operation of the SDRAM 200, a bank address BA, row address, and column address are sequentially latched by the address register 206 under control of the control circuit 202. In response to the latched bank address BA and row address, the control circuit 202 controls the row address multiplexer 212 to latch and output the row address to one of a row address latch 214 and 216. The row address latches 214 and 216, when activated, latch the row address from the row address multiplexer 212 and output this latched row address to an associated row decoder circuit 222 and 224, respectively. The row decoder circuits 222 and 224 decode the latched row address and activate a corresponding row of memory cells in memory banks 218 and 220, respectively. The memory banks 218 and 220 each include a number of memory cells (not shown) arranged in rows and columns, each memory cell operable to store a bit of data and having an associated row and column address.

When a column address is applied on the address bus 208, the column address is latched by the address register 206 under control of the control circuit 202, and output to a column address latch 210, which latches the column address and in turn outputs the column address to a burst counter circuit 226. The burst counter circuit 226 operates to develop sequential column addresses beginning with the latched column address when the SDRAM 200 is operating in a burst mode. The burst counter 226 outputs the developed column addresses to a column address buffer 228, which in turn outputs the developed column address to a pair column decoder circuits 230 and 231. The column decoder circuits 230 and 231 decode the column address and activates one of a plurality of column select signals 232 corresponding to the decoded column address. The column select signals 232 are output to sense amplifier and I/O gating circuits 234 and 236 associated with the memory banks 218 and 220, respectively. Within each of the sense amplifier and I/O gating circuits 234 and 236 is a signal generation circuit 110. This circuit is used to generate signals for accessing memory cells within an addressed row. The signal generation circuit 110 further operates to generate a pull-up signal coupled to selected I/O lines during memory circuit operation. The sense amplifier and I/O gating circuits 234 and 236 sense and store the data placed on the digit lines 235 and 237, respectively, by the memory cells in the addressed row and to thereafter couple the digit lines 235 or 237 corresponding to the addressed memory cell to an internal data bus 238. The internal data bus 238 is coupled to a data bus 240 of the SDRAM 200 through either a data input register 242 or a data output register 244. A data mask signal DQM controls the circuits 234 and 236 to avoid data contention on the data bus 240 when, for example, a READ command is followed immediately by a WRITE command, as known in the art.

In operation, during a read data transfer operation, an external circuit, such as a processor, applies a bank address BA and row address on the address bus 208 and provides an ACTIVE command to the command decode circuit 204. This applied address and command information is latched by the SDRAM 200 on the next rising edge of the external clock signal CLK, and the control circuit 202 thereafter activates the addressed memory bank 218 or 220. The supplied row address is coupled through the row address multiplexer 212 to the row address latch 214 or 216 associated with the addressed bank, and this row address is thereafter decoded and the row of memory cells in the activated memory bank 218 or 220 is activated. The sense amplifiers in the sense amplifier and I/O gating circuit 234 or 236 sense and store the data contained in each memory cell in the activated row of the addressed memory bank 218 or 220.

The external circuit thereafter applies a READ command to the command decode circuit 204 including a column address on the address bus 208, both of which are latched on the next positive-edge of the external clock signal CLK. The latched column address is then routed through the circuits 210, 226, and 228 to the column decoder circuit 230 under control of the control circuit 204. The column decoder 230 decodes the latched column address and activates the column select signal 232 corresponding to that decoded column address. In response to the activated column select signal 232, the sense amplifier and I/O gating circuit 234 or 236 transfers the addressed data onto the internal data bus 238, and the data is then transferred from the internal data bus 238 through the data output register 244 and onto the data bus 240 where it is read by the external circuit.

During a write data transfer operation, after activating the addressed memory bank 218 or 220 and the addressed row within that bank, the external circuit applies a WRITE command to the command decode circuit 204 including a column address on the address bus 208 and data on the data bus 240. The WRITE command, column address, and data are latched respectively into the command decode circuit 204, address register 206, and data input register 242 on the next positive-edge of the external clock signal CLK. The data latched in the data input register 242 is placed on the internal data bus 238, and the latched column address is routed through the circuits 210, 226, and 228 to the column decoder circuit 230 under control of the control circuit 204. The column decoder 230 decodes the latched column address and activates the column select signal 232 corresponding to that decoded address. In response to the activated column select signal 232, the data on the internal data bus 238 is transferred through the sense amplifier and I/O gating circuit 234 or 236 to the digit lines 235 or 237 corresponding to the addressed memory cell. The row containing the addressed memory cell is thereafter deactivated to store the written data in the addressed memory cell.

Although the signal generation circuit 110 has been described as being used in the SDRAM 200, it will be understood that it may also be used in other types of integrated circuits such as synchronous graphics RAM (SGRAM), video DRAM, etc.

Figure 6:
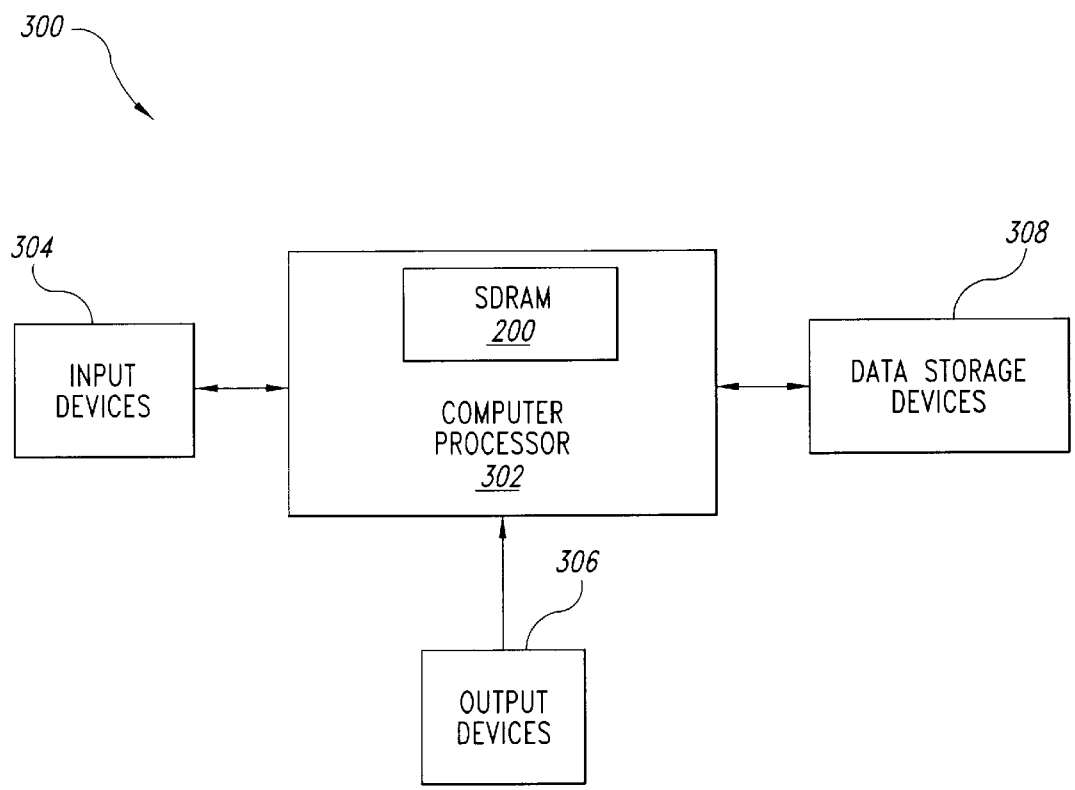
FIG. 6 is a block diagram of a computer system including the synchronous dynamic random access memory of FIG. 5.

FIG. 6 is a block diagram of a computer system 300 including the SDRAM 200 of FIG. 5. The computer system 300 includes a processor 302 for performing various computing functions, such as executing specific software to perform specific calculations or tasks. In addition, the computer system 300 includes one or more input devices 304, such as a keyboard or a mouse, coupled to the processor 302 to allow an operator to interface with the computer system 300. Typically, the computer system 300 also includes one or more output devices 306 coupled to the processor 302, such output devices typically being a printer or a video terminal. One or more data storage devices 308 are also typically coupled to the processor 302 to store data or retrieve data from external storage media (not shown). Examples of typical data storage devices 308 include hard and floppy disks, tape cassettes, and compact disk read-only memories (CD-ROMs). The processor 302 is typically coupled to the SDRAM 200 through a control bus, a data bus, and an address bus to provide for writing data to and reading data from the SDRAM, and a clocking circuit (not shown) typically develops a clock signal driving the processor 302 and SDRAM 200 during such data transfers.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claim.

We claim:

1. A pulse generation circuit for generating a pulse responsive to a trigger signal having a first and a second state, the pulse generation circuit comprising:

a passgate circuit having an input terminal adapted to receive the trigger signal, the passgate circuit having a passing state when enabled and a blocking state when disabled;

a gating circuit coupled to the passgate circuit, the gating circuit adapted to receive a first control signal derived from the trigger signal, the gating circuit configured to enable the passgate responsive to the control signal during a period at least encompassing the transition of the trigger signal from the first state to the second state; and a reset circuit coupled to the gating circuit and coupled to the passgate circuit, the reset circuit adapted to disable the passgate responsive to the control signal at a time subsequent to the transition of the trigger signal from the first state to the second state.

2. The pulse generation circuit of claim 1, further comprising an amplification circuit configured to receive the pulse as an input and produce an Input/Output pull-up signal at an output terminal.

3. The pulse generation circuit of claim 2 wherein the amplification circuit comprises a first and a second inverter, serially coupled, the first inverter coupled to the passgate circuit and adapted to accept the pulse at an input and produce an inverted and amplified signal at an output, the second inverter adapted to accept the output of the first inverter at an input and produce the Input/Output pull-up signal at an output.

4. The pulse generation circuit of claim 1 wherein the trigger signal is a periodic signal.

5. The pulse generation circuit of claim 1 wherein the pulse generated is a positive pulse, the first state of the trigger signal is a LOW state, and the reset circuit couples the output terminal of the passgate circuit to a ground voltage when it disables the passgate.

6. The pulse generation circuit of claim 1 wherein the gating circuit further comprises:

an inverter having an input terminal to receive the trigger signal and producing an inverted signal;

a delay circuit coupled to the inverter, the delay circuit accepting the inverted signal at an input and passing it to an output after a pre-selected time delay; and a logic gate having a plurality of inputs and an output, the logic gate adapted to accept at least the signal passed from the delay circuit, the logic gate generating a gating signal to enable the passgate.

7. The pulse generation circuit of claim 1 wherein the control signal is derived from the generated pulse.

8. A pull-up circuit to generate an Input/Output pull-up signal comprising:

a passgate circuit adapted to pass a periodic pulse received at an input terminal to an output terminal responsive to an enable signal received at an enable terminal, and adapted to block the periodic pulse from being passed responsive to a disable signal received at the enable terminal;

control circuitry coupled to the passgate circuit and adapted to receive a control signal derived from the periodic pulse, the control circuitry generating the enable signal and the disable signal responsive to the control signal;

a bias circuit coupled to the control circuitry and the passgate, the bias circuit adapted to bias the output terminal to a first state responsive to the disable signal; and a rectifyng circuit receiving the signal passed by the passgate circuit and converting it into the Input/Output pull-up signal.

9. The pull-up circuit of claim 8 wherein the rectifying circuit comprises a first and a second inverter, serially coupled, the first inverter coupled to the passgate circuit and adapted to accept the signal passed by the passgate circuit at an input and produce an inverted and amplified signal at an output, the second inverter adapted to accept the output of a first inverter at an input and produce the Input/Output pull-up signal at an output.

10. The pull-up circuit of claim 8 wherein the periodic pulse is a clock signal.

11. The pull-up circuit of claim 8 wherein the pulsed passed by the passgate circuit is a positive pulse, the beginning of which is generated when the periodic pulse changes from a first to a second state, and the end of which is generated when the bias circuit operates on the output terminal.

12. The pull-up circuit of claim 8 wherein the enable signal is generated before the passgate receives the periodic signal to pass to the output terminal.

13. The pull-up circuit of claim 8 wherein the control signal is derived from the pulse passed by the passgate.

14. A one-shot circuit for generating a pulse using a trigger signal as an input, the one-shot circuit comprising:

an input terminal adapted to accept a trigger signal having a first state and a second state;

a generated pulse output terminal coupled to the input terminal;

a control circuit coupled to the input and generated pulse output terminals, the control circuit having at least one control input accepting a control signal, the control signal decoded by the control circuit to pass or block the trigger signal from the input terminal to the generated pulse output terminal; and a reset switch coupled between the generated pulse output terminal and a reference voltage, the control circuit controlling the switch to connect the output terminal to a ground voltage responsive to the control signal.

15. The one-shot circuit of claim 14, further comprising an amplification circuit configured to receive the pulse as an input and produce an Input/Output pull-up signal at an output terminal.

16. The one-shot circuit of claim 15 wherein the amplification circuit comprises a first and a second inverter, serially coupled, the first inverter coupled to the generated pulse output terminal and accepting the generated pulse it an input, and producing an inverted and amplified signal at an output, the second inverter to accept the output of the first inverter at an input and produce the Input/Outpul pull-up signal at an output.

17. The one-shot circuit of claim 14 wherein the trigger signal is enabled to pass from the input terminal to the output terminal before a transition from the first state to the second state of the trigger signal.

18. The one-shot circuit of claim 14 wherein the control signal is derived from the generated pulse.

19. The one-shot circuit of claim 14 wherein the trigger signal is one of the control signals received at one of the control inputs of the control circuit.

20. The one-shot circuit of claim 14 wherein the generated pulse is a positive pulse, the first state of the trigger signal is a LOW state, and wherein the reset switch couples the output terminal to a ground voltage responsive to the control signal.

21. The one-shot circuit of claim 14 wherein the control circuit further comprises:

an inverter which accepts the trigger signal and produces an inverted signal;

a delay circuit coupled to the inverter, the delay circuit accepting the inverted signal at an input and passing it to an output after a pre-selected delay; and a logic gate having a plurality of inputs and an output, the logic gate adapted to accept the inverted signal passed from the delay circuit, the logic gate output coupled to a control input of the passgate.

22. A column decoder comprising:

digit lines coupled to Input/Output lines;

an address decoder adapted to decode an address received from an address bus and switchably couple selected digit lines to respective Input/Output lines;

an inactivation circuit adapted to switchably disconnect Input/Output lines from a bias voltage for a period following a transition of a periodic signal; and an Input/Output biasing circuit including:

a passgate circuit having an input terminal adapted to receive the periodic signal, the passgate circuit having a passing state when enabled and a blocking state when disabled, a gating circuit coupled to the passgate circuit, the gating circuit adapted to receive a first control signal derived from the periodic signal, the gating circuit configured to enable the passgate responsive to the control signal during a period at least encompassing the transition of the periodic signal from a first state to a second state, and a reset circuit coupled to the gating circuit and coupled to the passgate circuit, the reset circuit adapted to disable the passgate responsive to the control signal at a time subsequent to the transition of the periodic signal from the first state to the second state.

23. The column decoder of claim 22 wherein the periodic signal is a clock signal.

24. The column decoder of claim 22 wherein a pulse generated by the passgate is a positive pulse, the first edge of the periodic signal is a rising edge, and the reset circuit couples the output terminal of the passgate circuit to a ground voltage when it disables the passgate.

25. The column decoder of claim 22 wherein the control signal is derived from a generated pulse.

26. A clock buffer circuit for transferring a clock signal from an input terminal to an output terminal comprising:

a passgate circuit adapted to receive a clock signal having a first state and a second state, the passgate blocking or passing the clock signal responsive to an enable signal;

an enable generating circuit coupled to the passgate circuit, the enabled generating circuit adapted to decode a control signal derived from the clock signal and received at an input terminal, and adapted to generate an enable signal during a period at least during a transition of the clock signal from the first state to the second state; and a disable circuit coupled to the enable generating circuit and the passgate circuit, the disable circuit adapted to return the output of the passgate circuit to a first state at a time subsequent to the enable signal being generated.

27. The clock buffer circuit of claim 26 wherein the enable signal is generated prior to a rising edge of the clock signal and the disable circuit couples the output of the passgate circuit to a ground voltage.

28. The clock buffer circuit of claim 26 wherein the control signal is derived from the output of the passgate circuit.

29. A synchronous memory device comprising:

an address bus;

a control bus;

a data bus;

a clock terminal adapted to receive a clock signal;

a clock enable terminal adapted to receive a clock enable signal;

an address decoder coupled to the address bus;

a control logic circuit coupled to the control bus;

a read/write circuit coupled to the data bus;

a memory-cell array coupled to the address decoder, control circuit, and read/write circuit, including a plurality of row lines;

a plurality of pairs of first and second complementary digit lines;

an array of memory cells that each have a control terminal coupled to one of the row lines and a data terminal coupled to one of the first and second complementary digit lines of one of the pairs of complementary column lines; and a pulse generation circuit for generating a pulse responsive to a trigger signal having a first and a second state, the pulse generation circuit including:

a passgate circuit having an input terminal adapted to receive the trigger signal, the passgate circuit having a passing state when enabled and a blocking state when disabled, a gating circuit coupled to the passgate circuit, the gating circuit adapted to receive a first control signal derived from the trigger signal, the gating circuit configured to enable the passgate responsive to the control signal during a period at least encompassing the transition of the trigger signal from the first state to the second state, and a reset circuit coupled to the gating circuit and coupled to the passgate circuit, the reset circuit adapted to disable the passgate responsive to the control signal at a time subsequent to the transition of the trigger signal from the first state to the second state.

30. The pulse generation circuit of claim 29, further comprising an amplification circuit configured to receive the pulse as an input and produce an Input/Output pull-up signal at an output terminal.

31. The pulse generation circuit of claim 30 wherein the amplification circuit comprises a first and a second inverter, serially coupled, the first inverter coupled to the passgate circuit and adapted to accept the pulse signal at an input and produce an inverted and amplified signal at an output, the second inverter adapted to accept the output of the first inverter at an input and produce the Input/Output pull-up signal at an output.

32. The pulse generation circuit of claim 29 wherein the trigger signal is a periodic signal.

33. The pulse generation circuit of claim 32 wherein the periodic signal is a clock signal.

34. The pulse generation circuit of claim 29 wherein the pulse generated is a positive pulse, the first state of the trigger signal is a LOW state, and the reset circuit couples the output terminal of the passgate circuit to a ground voltage when it disables the passgate.

35. The pulse generation circuit of claim 29 wherein the gating circuit further comprises:

an inverter having an input terminal to receive the trigger signal and producing an inverted signal;

a delay circuit coupled to the inverter, the delay circuit accepting the inverted signal at an input and passing it to an output after a preselected time delay; and a logic gate having a plurality of inputs and an output, the logic gate adapted to accept at least the signal passed from the delay circuit, the logic gate generating a gating signal to enable the passgate.

36. A computer system comprising:

a data input device;

a data output device;

an address bus;

a data bus;

a control bus; and computing circuitry coupled to the data input and output devices, and the data, address and control busses, the computing circuitry including:

a pulse generation circuit for generating a pulse responsive to a trigger signal having a first and a second state, the pulse generation circuit comprising:

a passgate circuit having an input terminal adapted to receive the trigger signal, the passgate circuit having a passing state when enabled and a blocking state when disabled, a gating circuit coupled to the passgate circuit, the gating circuit adapted to receive a first control signal derived from the trigger signal, the gating circuit configured to enable the passgate responsive to the control signal during a period at least encompassing the transition of the trigger signal from the first state to the second state, and a reset circuit coupled to the gating circuit and coupled to the passgate circuit, the reset circuit adapted to disable the passgate responsive to the control signal at a time subsequent to the transition of the trigger signal from the first state to the second state.

37. The pulse generation circuit of claim 36, further comprising an amplification circuit configured to receive the pulse as an input and produce an Input/Output pull-up signal at an output terminal.

38. The pulse generation circuit of claim 37 wherein the amplification circuit comprises a first and a second inverter, serially coupled, the first inverter coupled to the passgate circuit and adapted to accept the pulse signal at an input and produce an inverted and amplified signal at an output, the second inverter adapted to accept the output of the first inverter at an input and produce the Input/Output pull-up signal at an output.

39. The pulse generation circuit of claim 36 wherein the trigger signal is a periodic signal.

40. The pulse generation circuit of claim 39 wherein the periodic signal is a clock signal.

41. The pulse generation circuit of claim 36 wherein the pulse generated is a positive pulse, the first edge of the trigger signal is a rising edge, and the reset circuit couples the output terminal of the passgate circuit to a ground voltage when it disables the passgate.

42. The pulse generation circuit of claim 36 wherein the gating circuit further comprises:

an inverter having an input terminal to receive the trigger signal and producing an inverted signal;

a delay circuit coupled to the inverter, the delay circuit accepting the inverted signal at an input and passing it to an output after a preselected time delay; and a logic gate having a plurality of inputs and an output, the logic gate adapted to accept at least the signal passed from the delay circuit, the logic gate generating a gating signal to enable the passgate.

43. A method for generating a pulse responsive to a trigger signal transitioning from a first state to a second state, the method including the steps of:

applying a trigger signal to a passgate;

enabling the passgate for a period of time at least encompassing the transition of the trigger signal from a first state to a second state; and disabling the passgate at a predetermined time subsequent to the transition of the trigger signal.

44. The method for generating a pulse of claim 43, further including the step of:

biasing an output of the passgate to a first state when the passgate is disabled.

45. The method for generating a pulse of claim 43 wherein the step of enabling the passgate depends from the trigger signal.

46. The method for generating a pulse of claim 43 wherein the step of enabling the passgate depends from an output of the passgate.

47. The method for generating a pulse of claim 43 wherein the trigger signal is a periodic signal.

48. A method of generating a pulse in a synchronous memory, the method comprising the steps of:

applying a trigger signal to a passgate;

enabling the passgate for a period of time at least encompassing the transition of the trigger signal from a first state to a second state; and disabling the passgate at a predetermined time subsequent to the transition of the trigger signal.

49. The method for generating a pulse of claim 48, further including the step of:

biasing an output of the passgate to a first state when the passgate is disabled.

50. The method for generating a pulse of claim 48 wherein the step of enabling the passgate depends from the trigger signal.

51. The method for generating a pulse of claim 48 wherein the step of enabling the passgate depends from an output of the passgate.

52. The method for generating a pulse of claim 48 wherein the trigger signal is a periodic signal.

* * * * *

UNITED STATES PATENT AND TRADEMARK OFFICE
CERTIFICATE OF CORRECTION

PATENT NO.    : 6,026,496
DATED         : February 15, 2000
INVENTOR(S)   : Jeffrey P. Wright and Steven F. Schicht Page 1 of 1

It is certified that error appears in the above-identified patent and that said Letters Patent is hereby corrected as shown below:

<u>Column 10,</u>
Line 13, "wherein the pulsed" -- wherein the pulse --.
Line 47, "generated pulse it an" -- generated pulse at an --.
Line 50, "the Input/Outpul pull-up" -- the Input/Output pull-up --.

Signed and Sealed this

Twenty-eighth Day of August, 2001

*Attest:*

*Nicholas P. Godici*

NICHOLAS P. GODICI
*Attesting Officer*        *Acting Director of the United States Patent and Trademark Office*